(12) United States Patent
Kwon et al.

(10) Patent No.: US 8,828,630 B2
(45) Date of Patent: Sep. 9, 2014

(54) PHOTOSENSITIVE RESIN COMPOSITION AND COLOR FILTER USING THE SAME

(75) Inventors: Ji-Yun Kwon, Uiwang-si (KR); Nam-Gwang Kim, Uiwang-si (KR); Shahrokh Motallebi, Uiwang-si (KR); In-Jae Lee, Uiwang-si (KR); Sun-Hee Jin, Uiwang-si (KR); Jae-Hyun Kim, Uiwang-si (KR); Hwan-Sung Cheon, Uiwang-si (KR); Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/589,483

(22) Filed: Aug. 20, 2012

(65) Prior Publication Data

US 2013/0122422 A1 May 16, 2013

(30) Foreign Application Priority Data

Nov. 11, 2011 (KR) .................. 10-2011-0117710

(51) Int. Cl.
*G03F 1/00* (2012.01)
(52) U.S. Cl.
USPC .......................... 430/7; 430/270.1; 430/281.1
(58) Field of Classification Search
USPC ........................ 430/7, 270.1, 281.1
See application file for complete search history.

(56) References Cited

U.S. PATENT DOCUMENTS

| | | | |
|---|---|---|---|
| 5,346,545 A | 9/1994 | Chassot | |
| 5,998,091 A | 12/1999 | Suzuki | |
| 6,033,813 A | 3/2000 | Endo et al. | |
| 6,733,935 B2 | 5/2004 | Kishimoto et al. | |
| 7,517,619 B2 | 4/2009 | Hosaka et al. | |
| 2002/0051926 A1* | 5/2002 | Takashima et al. | 430/138 |
| 2008/0048155 A1* | 2/2008 | Toriniwa et al. | 252/587 |
| 2008/0237553 A1* | 10/2008 | Miya et al. | 252/586 |
| 2009/0263612 A1* | 10/2009 | Gascoyne et al. | 428/64.4 |

FOREIGN PATENT DOCUMENTS

| | | |
|---|---|---|
| CN | 1969205 A | 5/2007 |
| CN | 101276146 A | 10/2008 |
| JP | 06-041458 A | 2/1994 |

(Continued)

OTHER PUBLICATIONS

Search Report in counterpart Chinese Application No. 201210249993.7 dated Feb. 25, 2014, pp. 1-2.

(Continued)

*Primary Examiner* — Stewart Fraser
(74) *Attorney, Agent, or Firm* — Additon, Higgins, Pendleton & Ashe, P.A.

(57) ABSTRACT

Disclosed are photosensitive resin composition that includes a dye including a methine-based compound represented by the following Chemical Formula 1, wherein each substituent of Chemical Formula 1 is the same as defined in the detailed description, and a metal complex, and a color filter using the same.

13 Claims, 2 Drawing Sheets

[Chemical Formula 1]

(56) References Cited

FOREIGN PATENT DOCUMENTS

| | | |
|---|---|---|
| JP | 06-199045 A | 7/1994 |
| JP | 07-140654 A | 6/1995 |
| JP | 10-086517 A | 4/1998 |
| JP | 10-254133 A | 9/1998 |
| JP | 2002-062642 | 2/2002 |
| JP | 2002-072463 | 3/2002 |
| JP | 2002-072464 | 3/2002 |
| KR | 1999-0007097 | 1/1999 |
| KR | 2002-0015650 A | 2/2002 |
| KR | 2005-0020653 A | 3/2005 |
| KR | 10-2008-0088518 A | 10/2008 |
| KR | 2009-0106226 A | 10/2009 |
| KR | 2010-0078845 A | 7/2010 |
| KR | 2010-0080142 A | 7/2010 |

OTHER PUBLICATIONS

English-translation of Search Report in counterpart Chinese Application No. 201210249993.7 dated Feb. 25, 2014, pp. 1-2.

Search Report in counterpart Taiwanese Application No. 101130126 dated Feb. 20, 2014, pp. 1.

English-translation of Search Report in counterpart Taiwanese Application No. 101130126 dated Feb. 20, 2014, pp. 1.

* cited by examiner

PHOTOSENSITIVE RESIN COMPOSITION AND COLOR FILTER USING THE SAME

CROSS-REFERENCE TO RELATED APPLICATION

This application claims priority to and the benefit of Korean Patent Application No. 10-2011-0117710 filed in the Korean Intellectual Property Office on Nov. 11, 2011, the entire disclosure of which is incorporated herein by reference.

FIELD

This disclosure relates to a photosensitive resin composition and a color filter using the same.

BACKGROUND

Recently, with increased use of large screen liquid crystal displays (LCDs), there is an increased demand for improved performance. Research has focused on increasing color filter productivity, since the color filter is the most important factor in realizing colors among the many parts of a liquid crystal display. In addition, in order to increase color purity of a large screen liquid crystal display, a color filter can be fabricated using a photosensitive resin composition having an increased concentration of a colorant. Accordingly, there is a need for a photosensitive resin composition with lowered development speed to increase productivity and yield in the manufacturing process and having excellent sensitivity despite little exposure to light.

A photosensitive resin composition can be used to fabricate a color filter through methods such as dyeing, electrophoretic deposition (EPD), printing, pigment dispersion, and the like, in which three or more colors are coated on a transparent substrate. Recently, the pigment dispersion has been more actively adopted.

A color filter manufactured using a pigment dispersion method, however, can have limitations with respect to luminance and contrast ratio that originates from pigment particle size.

SUMMARY

One embodiment provides a photosensitive resin composition that can have high luminance and contrast ratio.

Another embodiment provides a color filter fabricated using the photosensitive resin composition.

According to one embodiment, a photosensitive resin composition includes a dye including a methine-based compound represented by the following Chemical Formula 1 and a metal complex.

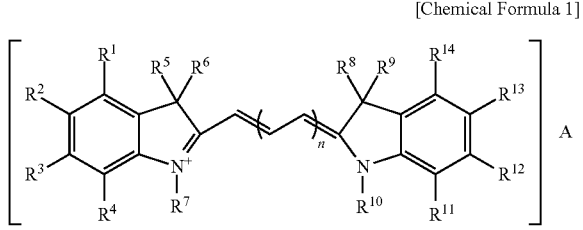

[Chemical Formula 1]

In Chemical Formula 1,
$R^1$ to $R^4$ and $R^{11}$ to $R^{14}$ are each independently hydrogen, halogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $R^5$, $R^6$, $R^8$ and $R^9$ are each independently hydrogen or substituted or unsubstituted C1 to C20 alkyl, $R^7$ and $R^{10}$ are each independently hydrogen, substituted or unsubstituted C1 to C20 alkyl, substituted or unsubstituted C1 to C20 alkyl(meth)acrylate, or substituted or unsubstituted C6 to C30 aryl, and n is an integer ranging from 1 to 4, and A is a halogen ion, $ClO_4^-$, $BF_4^-$, $SbF_6^-$, $CF_3SO_2^-$, $N(SO_2CF_3)_2^-$, or one of the compounds represented by following Chemical Formulas 2-1 and 2-2.

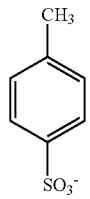

[Chemical Formula 2-1]

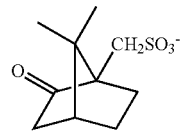

[Chemical Formula 2-2]

In exemplary embodiments, in Chemical Formula 1, each $R^5$, $R^6$, $R^8$, and $R^9$ is substituted or unsubstituted C1 to C20 alkyl, and each $R^7$ and $R^{10}$ is substituted or unsubstituted C1 to C20 alkyl.

In exemplary embodiments, in the above Chemical Formula 1, A may be $CF_3SO_3^-$ or $N(SO_2CF_3)_2^-$.

The methine-based compound can have a wavelength of re-emitted light ranging from about 400 to about 700 nm.

The metal complex may have a maximum absorption peak in the wavelength of about 200 to about 650 nm.

The metal complex may include at least one metal ion selected from Mg, Ni, Cu, Co, Zn, Cr, Pt, Pd, and Fe.

The metal complex may include a composite or complex of a metal ion and a dye selected from solvent yellow 19, solvent yellow 21, solvent yellow 25, solvent yellow 79, solvent yellow 82, solvent yellow 88, solvent orange 45, solvent orange 54, solvent orange 62, solvent orange 99, solvent red 8, solvent red 32, solvent red 109, solvent red 112, solvent red 119, solvent red 124, solvent red 160, solvent red 132, solvent red 218, and the like, and combinations thereof.

The photosensitive resin composition may include the dye in an amount of about 1 to about 80 wt % based on the total amount (weight) of the photosensitive resin composition.

The photosensitive resin composition may further include a pigment. Examples of the pigment may include without limitation C.I. pigment red 242, C.I. pigment red 214, C.I. pigment red 221, C.I. pigment red 166, C.I. pigment red 220, C.I. pigment red 248, C.I. pigment red 262, C.I. pigment red 254, C.I. pigment red 177, C.I. pigment yellow 150, and the like, and combinations thereof.

The photosensitive resin composition may include the dye and the pigment at a weight ratio of about 1:9 to about 9:1.

The photosensitive resin composition may further include about 0.1 to about 30 wt % of an acrylic-based binder resin; about 0.1 to about 5 wt % of a photopolymerization initiator; about 0.1 to about 30 wt % of a photopolymerizable monomer; and a balance amount of solvent.

According to another embodiment, provided is a color filter manufactured using the photosensitive resin composition.

Further embodiments of this disclosure are described in the following detailed description.

The photosensitive resin composition can provide both high luminance and contrast ratio, and may be used to produce a color filter that can have excellent pattern characteristics, development processibility, chemical resistance, and color reproducibility.

DETAILED DESCRIPTION

Figure 1:
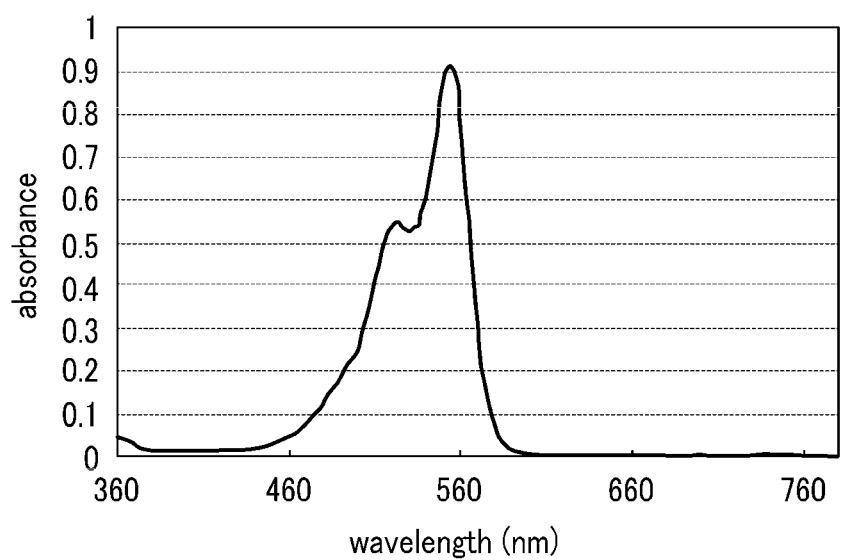
FIG. 1 is a UV spectrum graph of the methine-based compound used in Example 1.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term, "substituted" refers to one substituted with halogen (F, Cl, Br, I), a hydroxyl group, C1 to C20 alkoxy, a nitro group, a cyano group, an amine group, an azido group, an amidino group, a hydrazino group, a hydrazono group, a carbonyl group, a carbamyl group, a thiol group, an ester group, a carboxyl group or salts thereof, a sulfonic acid group or salts thereof, a phosphoric acid group or salts thereof, C1 to C20 alkyl, C2 to C20 alkenyl, C2 to C20 alkynyl, C6 to C30 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, or a combination thereof instead of at least one hydrogen.

As used herein, when a specific definition is not otherwise provided, the terms "heterocycloalkyl", "heterocycloalkenyl", "heterocycloalkynyl", and "heterocycloalkylene" refer to cycloalkyl, cycloalkenyl, cycloalkynyl, and cycloalkylene, respectively, including at least one heteroatom N, O, S, P or a combination thereof.

As used herein, when a specific definition is not otherwise provided, "(meth)acrylate" refers to both "acrylate" and "methacrylate".

According to one embodiment, a photosensitive resin composition includes (A) a dye including (A-1) a methine-based compound represented by the following Chemical Formula 1 and (A-2) a metal complex, and in another embodiment, (B) an acrylic-based binder resin, (C) a photopolymerization initiator, (D) a photopolymerizable monomer, and (E) a solvent.

Hereinafter, each component is described in detail.

(A) Dye
(A-1) Methine-Based Compound

The methine-based compound may be a compound represented by the following Chemical Formula 1.

[Chemical Formula 1]

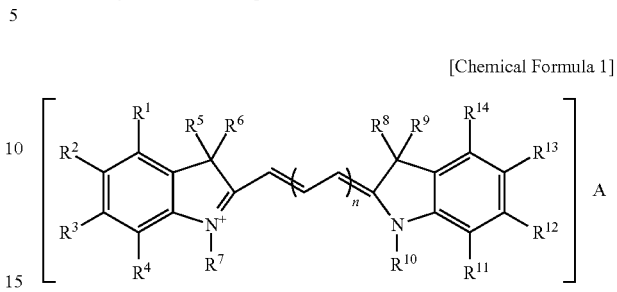

In Chemical Formula 1, $R^1$ to $R^4$ and $R^{11}$ to $R^{14}$ are each independently hydrogen, halogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

In Chemical Formula 1, each $R^5$, $R^6$, $R^8$ and $R^9$ can be hydrogen or substituted or unsubstituted C1 to C20 alkyl, and in one embodiment, each $R^5$, $R^6$, $R^8$ and $R^9$ can be substituted or unsubstituted C1 to C20 alkyl.

In Chemical Formula 1, each $R^7$ and $R^{10}$ is hydrogen, substituted or unsubstituted C1 to C20 alkyl, substituted or unsubstituted C1 to C20 alkyl(meth)acrylate, or substituted or unsubstituted C6 to C30 aryl. In one embodiment, each $R^7$ and $R^{10}$ can be substituted or unsubstituted C1 to C20 alkyl.

In Chemical Formula 1, n is an integer of 1 to 4.

In Chemical Formula 1, A is a halogen ion, $ClO_4^-$, $BF_4^-$, $SbF_6^-$, $CF_3SO_3^-$, $N(SO_2CF_3)_2^-$, or one of the compounds represented by the following Chemical Formulas 2-1 and 2-2, for example $CF_3SO_3^-$ or $N(SO_2CF_3)_2^-$.

[Chemical Formula 2-1]

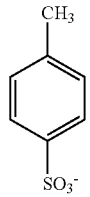

[Chemical Formula 2-2]

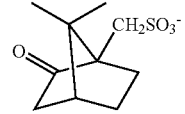

The methine-based compound is a molecule that is dyed itself and absorbs light of a visible region of spectrum, just like a typical dye. However, different from a typical dye, the methine-based compound is a molecule that re-emits fluorescent light of visible spectrum in a wavelength greater than the wavelength of absorbed light. The wavelength of the re-emitted light may range from about 400 to about 700 nm.

The methine-based compound may be a red dye.

When the methine-based compound which has high transmittance is used, a color filter having high luminance may be provided.

(A-2) Metal Complex

The metal complex may use a compound having a maximum absorption peak in the wavelength of about 200 to about 650 nm, and in order to match a color combination with color coordinates, a compound having an absorption wavelength of the range may use metal complexes of all colors that are dissolved in an organic solvent.

The metal complex may use a yellow dye having a maximum absorption peak in the wavelength of about 200 to about 400 nm, an orange dye having a maximum absorption peak in the wavelength of about 300 to about 500 nm, and/or a red dye having a maximum absorption peak in the wavelength of about 500 to about 650 nm.

The metal complex may be a direct dye, acidic dye, basic dye, acidic mordant dye, sulfur dye, reduction dye, azoic dye, disperse dye, reactivity dye, oxidation dye, alcohol soluble dye, azo dye, anthraquinone dye, indigoid dye, carbonium ion dye, phthalocyanine dye, nitro dye, quinoline dye, cyanine dye, polymethine dye, or a combination thereof.

The metal complex may include at least one metal ion selected from Mg, Ni, Cu, Co, Zn, Cr, Pt, Pd, and Fe.

The metal complex may include a composite (complex) of a metal ion and at least one dye including solvent yellow 19, solvent yellow 21, solvent yellow 25, solvent yellow 79, solvent yellow 82, solvent yellow 88, solvent orange 45, solvent orange 54, solvent orange 62, solvent orange 99, solvent red 8, solvent red 32, solvent red 109, solvent red 112, solvent red 119, solvent red 124, solvent red 160, solvent red 132, solvent red 218, or a combination thereof.

Although the above-described methine-based compound has a high luminescence characteristic, it has a characteristic of scattering polarization light. Therefore, it has a low contrast ratio. According to one embodiment, the low contrast ratio caused by the use of the methine-based compound may be improved by mixing the methine-based compound and the metal complex. Therefore, when a mixed dye including the methine-based compound and the metal complex is used, not only high luminance but also high contrast ratio may be simultaneously obtained.

According to one embodiment, the methine-based compound and the metal complex may be mixed in a weight ratio of about 50:1 to about 1:50. According to another embodiment, the methine-based compound and the metal complex may be mixed in a weight ratio of about 30:1 to about 1:30. According to another embodiment, the methine-based compound and the metal complex may be mixed in a weight ratio of about 5:1 to about 1:5. When the methine-based compound and the metal complex is mixed in a weight ratio range in the above range, luminance and contrast ratio may be improved.

The dye may have a solubility of greater than or equal to about 5 with respect to a solvent used in a photosensitive resin composition in accordance with one embodiment of the present invention, that is, the solvent (E), which is to be described later. According to another embodiment, the dye may have a solubility of about 5 to about 10. The solubility may be obtained by the amount (g) of the dye that is dissolved in about 100 g of the solvent. When the solubility of the dye is within the above range, dyeing power and compatibility with other components that constitute the photosensitive resin composition according to one embodiment may be obtained and the dye may be prevented from being precipitated.

Examples of the solvent may include without limitation propylene glycol monomethylether acetate (PGMEA), ethyl lactate (EL), ethylene glycol ethyl acetate (EGA), cyclohexanone, and the like, and combinations thereof.

The dye may simultaneously obtain high luminance and high contrast ratio by mixing and using the methine-based compound and the metal complex. According to one embodiment, a color filter having a transmittance of greater than or equal to about 95% at about 500 to about 800 nm may be provided.

The dye can have high heat resistance. In other words, when measured with a thermal weight analyzer (TGA), thermal decomposition temperature may be higher than or equal to about 200° C. According to another embodiment, it may range from about 200 to about 400° C.

A dye having the characteristic above may be usefully used in a color filter in various electronic products, such as LCDs and LEDs, that develops high luminance and high contrast ratio in desired color coordinates.

The photosensitive resin composition may include the dye in an amount of about 1 to about 80 wt % based on the total amount (weight) of the photosensitive resin composition. In some embodiments, the photosensitive resin composition may include the dye in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments of the present invention, the amount of dye can be in a range from about any of the foregoing amounts to about any other of the foregoing amounts.

When the dye is used in an amount within the above range, high luminance and contrast ratio may be shown in desired color coordinates.

(A') Pigment

The dye may be further mixed with a pigment and used, and in this case, the luminance and contrast ratio may be improved even more.

The pigment may be a red pigment.

Examples of the red pigment may include without limitation C.I. pigment red 242, C.I. pigment red 214, C.I. pigment red 221, C.I. pigment red 166, C.I. pigment red 220, C.I. pigment red 248, C.I. pigment red 262, C.I. pigment red 254, C.I. C.I. pigment red 177, and the like, and combinations thereof.

The pigment may include a yellow pigment, such as C.I. pigment yellow 150, as an auxiliary pigment to obtain the characteristics of a given color.

The pigment may be prepared as a dispersion solution and included in a photosensitive resin composition. Such a pigment dispersion may include the pigment and solvent, a dispersing agent, a binder resin, and the like.

Examples of the solvent may include without limitation ethylene glycol acetate, ethyl cellosolve, propylene glycol methyl ether acetate, ethyl lactate, polyethylene glycol, cyclohexanone, propylene glycol methyl ether, and the like, and combinations thereof. In exemplary embodiments, the solvent can include propylene glycol methyl ether acetate.

The dispersing agent helps uniformly disperse the pigment. Examples of the dispersing agent may include without limitation non-ionic, anionic, and/or cationic dispersing agents. Examples of the dispersing agent include without limitation polyalkylene glycol and esters thereof, polyoxy alkylene, polyhydric alcohol ester alkylene oxide addition products, alcohol alkylene oxide addition products, sulfonic acid esters, sulfonic acid salts, carboxylic acid esters, carboxylic acid salts, alkyl amide alkylene oxide addition products, alkyl amines, and the like. These dispersing agents can be used singularly or in a combination of two or more.

In addition, a carboxyl-containing acrylic-based resin as well as the dispersing agent can be added to the pigment in order to improve the pattern of pixels as well as stability of a pigment dispersion solution.

The pigment can have a primary particle diameter ranging from about 10 to about 70 nm. When the pigment has a primary particle diameter within the above range, it can have excellent stability in a dispersion solution and may improve resolution of pixels.

There is no particular limit on secondary particle diameter of the pigment. The pigment may have a secondary particle diameter of less than or equal to about 200 nm, taking into account resolution of pixels. In another embodiment, the pigment may have a secondary particle diameter ranging from about 70 to about 100 nm.

The dye and the pigment can be mixed in a weight ratio ranging from about 1:9 to about 9:1, for example, from about 3:7 to about 7:3.

In some embodiments, the mixture of the dye and the pigment can include the dye in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of dye can be in a range from about any of the foregoing amounts to about any other of the foregoing amounts.

In some embodiments, the mixture of the dye and the pigment can include the pigment in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of pigment can be in a range from about any of the foregoing amounts to about any other of the foregoing amounts.

When the dye and the pigment are mixed in a weight ratio within the above range, the composition can not only maintain color characteristics but also have high luminance and contrast ratio.

(B) Acrylic-Based Binder Resin

The acrylic-based binder resin is a copolymer of a first ethylenic unsaturated monomer and a second ethylenic unsaturated monomer that is copolymerizable with the first ethylenic unsaturated monomer, and can be a resin including at least one acrylic-based repeating unit.

The first ethylenic unsaturated monomer is an ethylenic unsaturated monomer including at least one carboxyl group. Examples of the ethylenic unsaturated monomer include without limitation acrylic acid, methacrylic acid, maleic acid, itaconic acid, fumaric acid, and the like, and combinations thereof.

The copolymer may include the first ethylenic unsaturated monomer in an amount ranging from about 5 to about 50 wt %, for example about 10 to about 40 wt %, based on the total amount (weight) of the acrylic-based binder resin. In some embodiments, the copolymer may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. They may be used singularly or as a mixture of more than two.

Examples of the acrylic-based binder resin may include without limitation methacrylic acid/benzyl methacrylate copolymers, methacrylic acid/benzyl methacrylate/styrene copolymers, methacrylic acid/benzyl methacrylate/2-hydroxyethyl methacrylate copolymers, methacrylic acid/benzyl methacrylate/styrene/2-hydroxyethylmethacrylate copolymers, and the like. They may be used singularly or as a mixture of two or more.

The acrylic-based binder resin may have a weight average molecular weight ranging from about 3000 to about 150,000 g/mol, for example about 5000 to about 50,000 g/mol, and as another example about 20,000 to about 30,000 g/mol. When the acrylic-based binder resin has a weight average molecular weight within the above range, the composition may have excellent close contacting property (adhesive) with a substrate, good physical and chemical properties, and appropriate viscosity.

The acrylic-based binder resin may have an acid value ranging from about 15 to about 60 mgKOH/g, for example about 20 to about 50 mgKOH/g. When the acrylic-based binder resin has an acid value within the above range, it can bring about excellent pixel resolution.

The photosensitive resin composition may include the acrylic-based binder resin in an amount ranging from about 0.1 to about 30 wt %, for example about 5 to about 20 wt %, based on the total amount (weight) of the photosensitive resin composition. In some embodiments, the photosensitive resin composition may include the acrylic-based binder resin in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range, the composition may have an excellent developing property and improved cross-linking, and thus can have excellent surface flatness when fabricated into a color filter.

(C) Photopolymerization Initiator

The photopolymerization initiator can be any generally used for preparing a photosensitive resin composition. Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoic acid, benzoyl benzoic acid methyl ester, 4-phenyl benzophenone, hydroxy benzophenone, acrylated benzophenone, 4,4'-bis(dimethyl amino)benzophenone, 4,4'-bis(diethylamino) benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis (trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphto1-yl)-4,6-bis(trichloromethyl)-s-triazine, 2-(4-methoxynaphto1-yl)-4,6-bis(trichloromethyl)-s-triazine, 2-4-trichloromethyl(piperonyl)-6-triazine, 2-4-trichloromethyl (4'-methoxystyryl)-6-triazine, and the like, and combinations thereof.

Examples of the oxime-based compound may include without limitation 2-(o-benzoyloxime)-1-[4-(phenylthio) phenyl]-1,2-octanedione, 1-(o-acetyloxime)-1-[9-ethyl-6-(2-methylbenzoyl)-9H-carbazole-3-yl]ethanone, and the like, and combinations thereof.

The photopolymerization initiator may include a carbazole-based compound, a diketone-based compound, a sulfonium borate-based compound, a diazo-based compound, a nonimidazole-based compound, and the like, and combinations thereof, other than the aforementioned photopolymerization initiators.

The photosensitive resin composition may include the photopolymerization initiator in an amount ranging from about 0.1 to about 5 wt %, for example about 1 to about 3 wt %, based on the total amount (weight) of the photosensitive resin composition. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, or 5 wt %. Further, according to some embodiments of the present invention, the amount of the photopolymerization initiator can be in a range from about any of the foregoing amounts to about any other of the foregoing amounts.

When the photopolymerization initiator is included in an amount within the above range, the composition may be sufficiently photopolymerized when exposed to light during the pattern-forming process for preparing a color filter, and can provide excellent sensitivity and improved transmittance.

(D) Photopolymerizable Monomer

The photopolymerization monomer may include a multifunctional monomer having two or more hydroxyl groups. Examples of the photopolymerization monomer may include without limitation glycerol acrylate, dipentaerythritol hexaacrylate, ethylene glycol diacrylate, triethylene glycol diacrylate, 1,4-butanedioldiacrylate, 1,6-hexanediol diacrylate, neopentyl glycol diacrylate, pentaerythritol diacrylate, pentaerythritol triacrylate, pentaerythritol diacrylate, dipentaerythritol triacrylate, dipentaerythritol acrylate, pentaerythritol hexaacrylate, bisphenol A diacrylate, trimethylol propane triacrylate, novolacepoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like, and combinations thereof.

The photosensitive resin composition may include the photopolymerization monomer in an amount ranging from about 0.1 to about 30 wt %, for example about 5 to about 20 wt %, based on the total amount (weight) of the photosensitive resin composition. In some embodiments, the photosensitive resin composition may include the photopolymerization monomer in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or wt %. Further, according to some embodiments of the present invention, the amount of the photopolymerization monomer can be in a range from about any of the foregoing amounts to about any other of the foregoing amounts.

When the photopolymerization monomer is included in an amount within the above range, the composition may have excellent pattern characteristics and developing property.

(E) Solvent

The solvent is not specifically limited. Examples of the solvent include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylethyl acetate, propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxyacetate alkyl esters such as methyl oxyacetate, ethyl oxyacetate, butyl oxyacetate, and the like; alkoxy alkyl acetate esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like; monooxy monocarboxylic acid alkyl esters of a 2-alkoxy-2-methyl propionic acid alkyl esters such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate; ketonic acid esters such as ethyl pyruvate; and the like, and combinations thereof. Furthermore, the solvent may include N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, carbonate ethylene, carbonate propylene, phenyl cellosolve acetate, and the like. These solvents may be used singularly or in a combination.

The solvent, considering miscibility, reactivity, and the like, may include glycol ethers such as ethylene glycol monoethyl ether and the like; ethylene glycol alkylether acetates such as ethyl cellosolve acetate and the like; esters such as 2-hydroxy ethyl propionate and the like; diethylene glycols alkylether such as diethylene glycol monomethyl ether and the like; propylene glycol alkylether acetates such as propylene glycol monomethylether acetate, propylene glycol propylether acetate, and the like; or a combinations thereof.

The photosensitive resin composition may include the solvent in a balance amount, for example in an amount ranging from about 20 to about 90 wt %, based on the total amount (weight) of the photosensitive resin composition. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition may have excellent coating properties and maintain excellent flatness in a layer having a thickness of greater than or equl to about 3 μm.

(F) Surfactant

The photosensitive resin composition may further include a surfactant to uniformly disperse the pigment into the solvent and to improve leveling performance.

The surfactant may be a fluorine-based surfactant.

Examples of the fluorine-based surfactant may include without limitation F-482, F-484, F-478, and the like and combinations thereof made by DIC Co., Ltd.

The surfactant may include a silicon-based surfactant as well as the fluorine-based surfactant.

Examples of the silicon-based surfactant may include without limitation TSF400, TSF401, TSF410, TSF4440, and the like and combinations thereof made by Toshiba Silicon Co., Ltd.

The photosensitive resin composition may include the surfactant in an amount ranging from about 0.01 to about 5 parts by weight, for example about 0.1 to about 2 parts by weight, based on about 100 parts by weight of the photosensitive resin composition. In some embodiments, the photosensitive resin composition may include the surfactant in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, or 5 parts by weight. Further, according to some embodiments of the present invention, the amount of the surfactant can be in a range from about any of the foregoing amounts to about any other of the foregoing amounts.

When the surfactant is included in an amount within the above range, the composition may have fewer impurities generated after development.

(G) Other Additive(s)

The photosensitive resin composition may further include one or more other additives such as malonic acid, 3-amino-1,2-propanediol, or a vinyl- or (meth)acryloxy-containing silane-based coupling agent, in order to prevent stains or spots during coating, to adjust leveling, or to prevent pattern residue due to non-development. These additives may be adjusted in an amount depending on desired properties, which will be well understood by the skilled artisan.

In addition, the photosensitive resin composition may additionally include an epoxy compound to improve the close contacting (adhesive) property and other characteristics if needed.

Examples of the epoxy compound may include without limitation epoxy novolac acryl carboxylate resins, ortho cresol novolac epoxy resins, phenol novolac epoxy resins, tetra methyl biphenyl epoxy resins, bisphenol A-type epoxy resins, alicyclic epoxy resins, and the like, and combinations thereof.

When the epoxy compound is included, a peroxide initiator or a radical polymerization initiator such as an azobis-based initiator can be additionally included.

The photosensitive resin composition may include the epoxy compound may in an amount of about 0.01 to about 5 parts by weight, based on about 100 parts by weight of the photosensitive resin composition. In some embodiments, the photosensitive resin composition may include the epoxy in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, or 5 parts by weight. Further, according to some embodiments of the present invention, the amount of the epoxy can be in a range from about any of the foregoing amounts to about any other of the foregoing amounts.

When the epoxy compound is included in an amount within the above range, storage, close contacting (adhesive), and other properties may be improved.

There is no particular limit to the method of making the photosensitive resin composition. In exemplary embodiments, the photosensitive resin composition can be prepared by mixing the aforementioned dye, acrylic-based binder resin, photopolymerization initiator, photopolymerization monomer, and solvent, and optionally one or more additives.

According to another embodiment, provided is a color filter fabricated using the photosensitive resin composition.

This color filter may be fabricated using any generally known method. In exemplary embodiments, the photosensitive resin composition can be applied to a substrate using spin-coating, roller-coating, slit-coating, and the like to provide a layer with a thickness ranging from about 1.5 to about 2.0 μm. After the coating step, the layer can be radiated with UV, electron beam, or X-ray radiation to form a pattern required for a color filter. The UV radiation may have a wavelength region ranging from about 190 to about 450 nm, for example from about 200 to about 400 nm. Next, the coated layer can be treated with an alkali developing solution. When the coated layer is treated with an alkali developing solution, the unradiated region thereof may be dissolved, forming a pattern for an image color filter. This process can be repeated depending on the necessary number of R, G, and B colors, to fabricate a color filter having a desired pattern. In addition, the image pattern acquired by development can be cured using heat treatment, actinic ray radiation, and the like, which can improve crack resistance, solvent resistance, and the like.

Hereinafter, the present invention is illustrated in more detail with reference to examples. However, these are exemplary embodiments of present invention and are not limiting.

(Preparation of Photosensitive Resin Composition)

Photosensitive resin compositions are prepared using the following components.

(A) Dye (A-1) Methine-Based Compound

KCF R008 (Kyung-In Synthetic Corporation) is used.

(A-2) Metal Complex

Yellow R (Kyung-In Synthetic Corporation) is used.

(A') Pigment (A'-1) A mixture of C.I. pigment red 254 and C.I. pigment red 177 mixed in a weight ratio of 60:40 and solid content of 4.9% is used.

(A'-2) A C.I. pigment yellow 150 is used.

(B) Acrylic-Based Binder Resin

A methacrylic acid/benzyl methacrylate copolymer having a weight average molecular weight of 28,000 g/mol, which is mixed in a weight ratio of 30:70 is used.

(C) Photopolymerization Initiator

CGI-124 made by Ciba Specialty Chemicals Co. is used.

(D) Photopolymerizable Monomer

Dipentaerythritolhexaacrylate is used.

(E) Solvent (E-1) A mixture of propylene glycol monomethyl ether acetate and cyclohexanone is used.

(E-2) A mixture of propylene glycol monomethyl ether acetate and ethyl 3-ethoxypropionate is used.

(F) Surfactant

A fluorine-based surfactant (F-482, DIC Co., Ltd.) is used.

EXAMPLE 1

2 g of the photopolymerization initiator (C) is dissolved in 44.5 g of propylene glycol monomethyl ether acetate and 15 g of cyclohexanone as the solvent (E-1). The solution is agitated at room temperature for 2 hours. Subsequently, 2.9 g of methine-based compound A-1 and 0.1 g of metal complex A-2 are added and agitated for 30 minutes, and then 15 g of an acrylic-based binder resin (B) and 20 g of a photopolymerizable monomer (D) are added and agitated at room temperature for 2 hours. Subsequently, 0.5 g of a surfactant (F) is added and agitated at room temperature for 1 hour. The solution is filtrated three times to remove impurities to prepare a photosensitive resin composition.

EXAMPLE 2

A photosensitive resin composition is prepared according to the same method as Example 1, except that 2.5 g of the methine-based compound A-1 and 0.5 g of the metal complex A-2 are added.

EXAMPLE 3

A photosensitive resin composition is prepared according to the same method as Example 1, except that 2.0 g of the methine-based compound A-1 and 1.0 g of the metal complex A-2 are added.

EXAMPLE 4

A photosensitive resin composition is prepared according to the same method as Example 1, except that 1.5 g of the methine-based compound A-1 and 1.5 g of the metal complex A-2 are added.

EXAMPLE 5

A photosensitive resin composition is prepared according to the same method as Example 1, except that 1.3 g of the methine-based compound A-1 and 1.7 g of the metal complex A-2 are added.

COMPARATIVE EXAMPLE 1

A photosensitive resin composition is prepared according to the same method as Example 1, except that 3.0 g of the methine-based compound A-1 is used and the metal complex A-2 is not used.

COMPARATIVE EXAMPLE 2

A photosensitive resin composition is prepared according to the same method as Example 1, except that 3.0 g of the metal complex A-2 is used and the methine-based compound A-1 is not used.

EXAMPLE 6

2 g of the photopolymerization initiator (C) is dissolved in 29.5 g of propylene glycol monomethyl ether acetate and 15 g of cyclohexanone as the solvent (E-1). The solution is agitated at room temperature for 2 hours. Subsequently, 1 g of methine-based compound A-1 and 1 g of metal complex A-2 are added and agitated for 30 minutes, and then 15 g of the acrylic-based binder resin (B) and 20 g of the photopolymerizable monomer (D) are added and agitated at room temperature for 2 hours. 14 g of the pigment A'-1 and 2 g of the pigment A'-2 are added, and agitated at room temperature for one hour, and then 0.5 g of the surfactant (F) is added and agitated at room temperature for one hour. The solution is filtrated three times to remove impurities to prepare a photosensitive resin composition.

COMPARATIVE EXAMPLE 3

2 g of the photopolymerization initiator (C) is dissolved in 29.8 g of propylene glycol monomethyl ether acetate and 15 g of ethyl 3-ethoxypropionate as the solvent (E-2). The solution is agitated at room temperature for 2 hours. Subsequently, 5 g of the acrylic-based binder resin (B) and 10 g of the photopolymerizable monomer (D) are added and agitated at room temperature for 2 hours. 33.8 g of the pigment A'-1 and 3.9 g of the pigment A'-2 are added and agitated at room temperature for one hour, and then 0.5 g of the surfactant (F) is added and agitated at room temperature for one hour. The solution is filtrated three times to remove impurities to prepare a photosensitive resin composition.

Evaluation 1: Evaluation of Spectroscopic Characteristic of Dye

Figure 2:
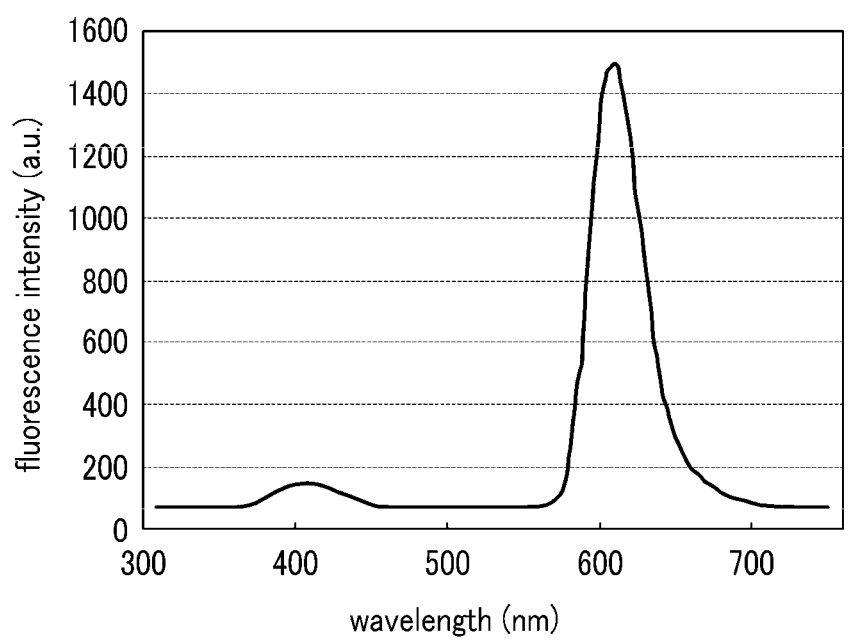
FIG. 2 is a fluorescent spectrum graph of the methine-based compound used in Example 1.

FIG. 1 is a UV spectrum graph of a methine-based compound used in Example 1. FIG. 2 is a fluorescent spectrum graph of a methine-based compound used in Example 1.

Referring to FIGS. 1 and 2, since the methine-based compound has a maximum absorption wavelength of about 555 nm and fluorescence, light is emitted at 610 nm which is longer than the absorption wavelength.

(Pattern Formation for a Color Filter)

The photosensitive resin compositions according to Examples 1 to 6 and Comparative Examples 1 to 3 respectively are coated on a 10×10 cm² glass substrate in a spin-coating method and then pre-baked at 90° C. for 3 minutes. The resultant products are cooled under air and then radiated by UV having a wavelength of 365 nm to an exposure amount of 100 mJ/cm², fabricating thin films. After the radiation, the thin films are post-baked at 230° C. in a hot air drier for 30 minutes, preparing a cured thin film.

Evaluation 2: Luminance and Contrast Ratio of Photosensitive Resin Composition

The color coordinates, luminance, and contrast ratio of the cured thin films according to Examples 1 to 6 and Comparative Examples 1 to 3 are measured according to the following methods. The results are shown in the following Table 1.

(1) Color coordinates (x and y) and luminance (Y): a colorimeter (MCPD 3000, Korea Otsuka Pharmaceutical Co., Ltd.) is used.

(2) Contrast ratio: a contrast ratio measurement device (Tsubosaka Electronic Co. Ltd., CT-1, 30,000:1) is used.

TABLE 1

|  | Color coordinate | | Luminance | |
|---|---|---|---|---|
|  | x | y | Y | Contrast ratio |
| Example 1 | 0.414 | 0.168 | 16.9 | 2,000 |
| Example 2 | 0.450 | 0.180 | 17.8 | 2,500 |
| Example 3 | 0.550 | 0.215 | 18.5 | 5,300 |
| Example 4 | 0.600 | 0.292 | 19.3 | 8,500 |
| Example 5 | 0.655 | 0.325 | 19.6 | 12,100 |
| Comparative Example 1 | 0.414 | 0.165 | 16.5 | 1,377 |
| Comparative Example 2 | 0.482 | 0.494 | 85.6 | 15,000 |
| Example 6 | 0.655 | 0.325 | 18.9 | 13,000 |
| Comparative Example 3 | 0.655 | 0.325 | 18.5 | 12,000 |

As seen from Table 1, Examples 1 to 5 which include a mixed dye of the methine-based compound and the metal complex in accordance with one embodiment have both high luminance and high contrast ratio. Also, in Examples 1 to 4, as the amount of the methine-based compound is decreased, luminance and contrast ratio are increased while the color coordinates x and y are increased.

In contrast, Comparative Examples 1 and 2 which include only one of the methine-based compound and the metal complex have different color coordinates from conventional color targets. Also when the methine-based compound is used singularly, the contrast ratio is very low, and when the metal complex is used singularly, the color is almost close to yellow.

Also, Comparative Example 3 which includes only a pigment has low luminance and low contrast ratio, compared with Example 6 that includes a mixture of the methine-based compound, the metal complex and a pigment.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition comprising:
about 1 to about 80 wt % of a dye including a methine-based compound represented by the following Chemical Formula 1 and a metal complex:

[Chemical Formula 1]

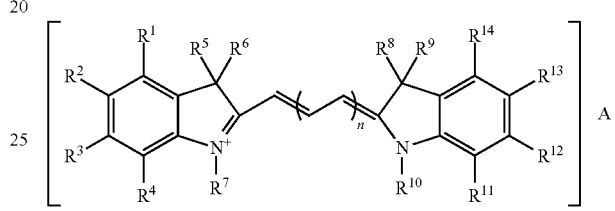

wherein, in Chemical Formula 1, $R^1$ to $R^4$ and $R^{11}$ to $R^{14}$ are each independently hydrogen, halogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $R^5$, $R^6$, $R^8$ and $R^9$ are each independently hydrogen or substituted or unsubstituted C1 to C20 alkyl, $R^7$ and $R^{10}$ are each independently hydrogen, substituted or unsubstituted C1 to C20 alkyl, substituted or unsubstituted C1 to C20 alkyl(meth)acrylate, or substituted or unsubstituted C6 to C30 aryl, n is an integer ranging from 1 to 4, and A is a halogen ion, $ClO_4^-$, $BF_4^-$, $SbF_6^-$, $CF_3SO_3^-$, $N(SO_2CF_3)_2^-$, or one of the compounds represented by following Chemical Formulas 2-1 and 2-2:

[Chemical Formula 2-1]

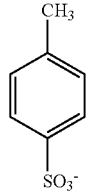

[Chemical Formula 2-2]

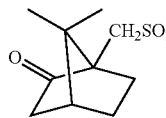

about 0.1 to about 30 wt % of an acrylic-based binder resin;
about 0.1 to about 5 wt % of a photopolymerization initiator;
about 0.1 to about 30 wt % of a photopolymerizable monomer; and
a balance amount of a solvent,
wherein the amounts are based on the total amount of the photosensitive resin composition.

2. The photosensitive resin composition of claim 1, wherein in Chemical Formula 1, each $R^5$, $R^6$, $R^8$ and $R^9$ is substituted or unsubstituted C1 to C20 alkyl, and each $R^7$ and $R^{10}$ is substituted or unsubstituted C1 to C20 alkyl.

3. The photosensitive resin composition of claim 1, wherein in Chemical Formula 1, A is $CF_3SO_3^-$ or $N(SO_2CF_3)_2^-$.

4. The photosensitive resin composition of claim 1, wherein the methine-based compound has a wavelength of re-emitted light of about 400 to about 700 nm.

5. The photosensitive resin composition of claim 1, wherein the metal complex has a maximum absorption peak in a wavelength of about 200 to about 650 nm.

6. The photosensitive resin composition of claim 1, wherein the metal complex comprises at least one metal ion comprising Mg, Ni, Cu, Co, Zn, Cr, Pt, Pd, or Fe.

7. The photosensitive resin composition of claim 1, wherein the metal complex comprises a composite of a metal ion and at least one dye comprising solvent yellow 19, solvent yellow 21, solvent yellow 25, solvent yellow 79, solvent yellow 82, solvent yellow 88, solvent orange 45, solvent orange 54, solvent orange 62, solvent orange 99, solvent red 8, solvent red 32, solvent red 109, solvent red 112, solvent red 119, solvent red 124, solvent red 160, solvent red 132, solvent red 218, or a combination thereof.

8. The photosensitive resin composition of claim 1, wherein the photosensitive resin composition further comprises one or more pigments.

9. The photosensitive resin composition of claim 8, wherein the pigment includes C.I. pigment red 242, C.I. pigment red 214, C.I. pigment red 221, C.I. pigment red 166, C.I. pigment red 220, C.I. pigment red 248, C.I. pigment red 262, C.I. pigment red 254, C.I. pigment red 177, C.I. pigment yellow 150, or a combination thereof.

10. The photosensitive resin composition of claim 8, wherein the photosensitive resin composition comprises the dye and the pigment at a weight ratio of about 1:9 to about 9:1.

11. A color filter manufactured using the photosensitive resin composition according to claim 1.

12. The photosensitive resin composition of claim 1, wherein the dye includes the methine-based compound and the metal complex in a weight ratio of about 30:1 to about 1:30.

13. The photosensitive resin composition of claim 1, wherein the dye includes the methine-based compound and the metal complex in a weight ratio of about 5:1 to about 1:5.

* * * * *

UNITED STATES PATENT AND TRADEMARK OFFICE
CERTIFICATE OF CORRECTION

PATENT NO. : 8,828,630 B2  
APPLICATION NO. : 13/589483  
DATED : September 9, 2014  
INVENTOR(S) : Ji-Yun Kwon et al.

Page 1 of 1

It is certified that error appears in the above-identified patent and that said Letters Patent is hereby corrected as shown below:

In the Specification

Column 2, Line 19 reads: "A is a halogen ion, $ClO_4^-$, $BF_4^-$, $SbF_6^-$, $CF_3SO_2^-$,"  
and should read: "A is a halogen ion, $ClO_4^-$, $BF_4^-$, $SbF_6^-$, $CF_3SO_3^-$,"

Column 10, Line 30 reads: "21, 22, 23, 24, 25, 26, 27, 28, 29, or wt%. Further, according"  
and should read: "21, 22, 23, 24, 25, 26, 27, 28, 29, or 30 wt%. Further, according"

Signed and Sealed this  
Thirteenth Day of January, 2015

Michelle K. Lee  
*Deputy Director of the United States Patent and Trademark Office*